(12) United States Patent
Rienzo (10) Patent No.: US 6,385,551 B1
(45) Date of Patent: May 7, 2002

(54) METHODS AND APPARATUS FOR OBTAINING A CONNECTION CHARACTERISTIC OF A CONNECTION ASSEMBLY

(75) Inventor: Frank Rienzo, Mendon, MA (US)

(73) Assignee: EMC Corporation, Hopkinton, MA (US)

( * ) Notice: Subject to any disclaimer, the term of this patent is extended or adjusted under 35 U.S.C. 154(b) by 152 days.

(21) Appl. No.: 09/609,966

(22) Filed: Jul. 5, 2000

(51) Int. Cl.[7] .............................. A47B 97/00; H05K 7/14
(52) U.S. Cl. ..................... 702/105; 312/323.1; 312/111; 361/681; 361/725
(58) Field of Search ........................... 312/223.2, 223.6, 312/111; 361/724, 725, 727, 726, 685; 320/119; 267/136; 702/105

(56) References Cited

U.S. PATENT DOCUMENTS

| | | | | |
|---|---|---|---|---|
| 4,687,243 A | * | 8/1987 | Rienzo | 294/86.4 |
| 6,199,839 B1 | * | 3/2001 | Rienzo | 267/136 |
| 6,300,847 B1 | * | 10/2001 | Gallagher | 333/33 |
| 6,323,423 B1 | * | 11/2001 | Tirrell | 312/223.2 |
| 6,325,472 B1 | * | 12/2001 | Tirrell | 312/223.1 |

* cited by examiner

*Primary Examiner*—Kamini Shah
(74) *Attorney, Agent, or Firm*—Chapin & Huang, L.L.C.; David E. Huang (57) ABSTRACT

The invention is directed to techniques for obtaining a connection characteristic (e.g., pin wipe) of a connection assembly having a first set of contacts (e.g., pin-receiving contacts of circuit board connectors) and a second set of contacts (e.g., pins of backplane connectors) using less destructive approaches than a conventional disassembly approach. In particular, the invention does not rely on disassembling a backplane from a card cage and cutting connectors. Rather, in one arrangement, the invention uses a test structure in place of a normal operating circuit board. The test structure includes a support member (e.g., circuit board material) that supports the first set of contacts, and that is capable of moving relative to the second set of contacts. The test structure further includes a detection circuit, coupled to the support member, that detects an electrical event resulting from movement of the first set of contacts relative to the second set of contacts (e.g., making electrical contact between the first and second sets of contacts). The test structure also includes a measuring device, coupled to the support member, that identifies position coordinates resulting from movement of the first set of contacts relative to the second set of contacts. The measuring device enables a user to identify (i) a first position coordinate in response to the electrical event resulting from movement of the first set of contacts relative to the second set of contacts, and (ii) a second position coordinate in response to a mechanical event resulting from movement of the first set of contacts relative to the second set of contacts (e.g., the first set of contacts reaching a fully seated position relative to the second set of contacts). A difference between the first and second position coordinates provides the connection characteristic of the connection assembly. Preferably, the test structure is reusable and portable, and can be used to measure connection characteristics of products in a manufacturing assembly line, or out in the field (e.g., at customer sites).

21 Claims, 7 Drawing Sheets

METHODS AND APPARATUS FOR OBTAINING A CONNECTION CHARACTERISTIC OF A CONNECTION ASSEMBLY

BACKGROUND OF THE INVENTION

A typical computer system includes a connection structure for connecting multiple circuit boards of the computer system together (e.g., processor boards, memory boards, etc.) One such connection structure includes a backplane and a set of backplane connectors mounted to the backplane. For such a structure, the circuit boards include circuit board connectors which mate with the backplane connectors. That is, the backplane connectors and circuit board connectors typically include complementary sets of contacts, e.g., pins and pin-receiving contacts, which are configured to make effective electrical contact with each other when the backplane connectors and circuit board connectors mate. The distance from when such pins initially make electrical contact with their complementary pin-receiving contacts (the point of contact) and when the pins become fully seated within the pin-receiving contacts is commonly referred to as "pin wipe".

Installation of a circuit board into a computer system typically involves a user sliding the circuit board into an opening of a card cage of the connection structure. The backplane typically resides at the rear end of the card cage (or in the middle of the card cage if the card cage is configured to receive circuit boards through both ends). As the circuit board slides within the card cage, circuit board connectors along the edge of the circuit board eventually engage backplane connectors mounted to the backplane at the rear of the card cage. After the circuit board connectors make electrical contact with the backplane connectors, the user continues to slide the circuit board further into the card cage until the circuit board moves into a fully seated position within the card cage (e.g., until the circuit board connectors reach an interference fit with the backplane connectors, or until the user has fully closed levers of the card cage or the circuit board, etc.). The user can repeat this installation process for other circuit boards as well.

Often, the circuit board or card cage includes one or more levers which the user operates when moving the circuit board into its fully seated the position. Such levers assist the user in properly positioning the circuit board within the card cage such that the circuit board connectors correctly align with the backplane connectors. Additionally, the levers enable the user to evenly provide the proper amount of insertion force so that the contacts (e.g., pin-receiving contacts) of the circuit board connectors properly mate with the contacts (e.g., pins) of the backplane connectors.

Low amounts of pin wipe (the available region for electrical contact between circuit board contacts and backplane contacts) may result in poor electrical connectivity between the circuit boards and the backplane. In some situations, low amounts of pin wipe can cause intermittent breaks in electrical pathways between one or more circuit boards and the backplane resulting in computer system failures or errors.

There can be many causes for low amounts of pin wipe. For example, one cause can be a poor connector design (e.g., the pins, the pin-receiving contacts or both can be too short to adequately provide sufficient electrical connectivity). Another cause can be poor manufacturing of connection components (e.g., the connector components may exceed their design tolerances thus preventing the connectors from providing an intended amount of pin wipe). In low pin wipe conditions, movement of the computer system (e.g., due to vibrations of one or more cooling fans) tends to exacerbate poor electrical connectivity situations often resulting in intermittent failures making the cause of the failure, i.e., insufficient pin wipe, difficult to identify.

One approach to identifying an insufficient pin wipe situation is to dissemble the connection structure and perform a visual inspection. In particular, a human inspector first removes a circuit board from the computer system in order to access the circuit board connectors, and extracts the backplane (and mounted backplane connectors) from the computer system in order to clearly view the backplane connectors. The inspector then cross-sectionally cuts (e.g., using a high-speed precision saw) through the circuit board connectors and the backplane connectors. Next, the inspector moves the circuit board toward the backplane in order to engage the remaining portion of the circuit board connectors with the remaining portion of the backplane connectors. The inspector provides such movement in an attempt to simulate installation of the circuit board within the computer system. While the inspector engages the connectors, the inspector measures the distance between connectors at the point of contact between connector contacts, and when the connectors reach the fully seated position, in order to determine the actual amount of pin wipe provided by the connectors.

SUMMARY OF THE INVENTION

Unfortunately, there are deficiencies to measuring pin wipe using the disassembly approach involving extracting of the backplane from the card cage, and cutting of the circuit board and backplane connectors. For example, this approach requires the labor-intensive task of removing the backplane from the card cage (e.g., removing screws, nuts, bolts, etc.). Furthermore, this approach requires cutting through the circuit board and backplane connectors to expose the circuit board and backplane contacts which typically requires a precision saw in order to leave portions of the connectors intact. Additionally, as the inspector moves the circuit board toward the backplane to simulate circuit board installation, the inspector must make a proper visual determination of when the circuit board connectors make electrical contact with the backplane connectors, and such visual determinations can often be inaccurate. Moreover, there is no guarantee that the inspector has accurately simulated installation of the circuit board within the computer system. For example, the circuit board connectors may normally reach a fully seated position relative within the backplane connectors when levers assisting circuit board installation reach a closed position, but the inspector may attempt to measure pin wipe by forcing the circuit board connectors further into the backplane connectors until the circuit board connectors reach an interference fit with the backplane connectors. Such a measurement may overstate the amount of actual pin wipe provided in similar configurations in the field which avoid such further insertion of the circuit boards once the levers have reached a fully closed position.

In contrast to the conventional disassembly approach, the invention is directed to techniques for obtaining a connection characteristic (e.g., pin wipe) of a connection assembly having a first set of contacts (e.g., pin-receiving contacts of circuit board connectors) and a second set of contacts (e.g., pins of backplane connectors) using less destructive approaches. In particular, the invention does not rely on disassembling a backplane from a card cage and cutting connectors. Rather, in one arrangement, the invention uses a test structure in place of a normal operating circuit board. The test structure includes a support member (e.g., circuit board material) that supports the first set of contacts, and that is capable of moving relative to the second set of contacts. The test structure further includes a detection circuit, coupled to the support member, that detects an electrical event resulting from movement of the first set of contacts relative to the second set of contacts (e.g., making electrical contact between the first and second sets of contacts). The test structure also includes a measuring device, coupled to the support member, that identifies position coordinates resulting from movement of the first set of contacts relative to the second set of contacts. The measuring device enables a user to identify (i) a first position coordinate in response to the electrical event resulting from movement of the first set of contacts relative to the second set of contacts, and (ii) a second position coordinate in response to a mechanical event resulting from movement of the first set of contacts relative to the second set of contacts (e.g., the first set of contacts reaching a fully seated position relative to the second set of contacts). A difference between the first and second position coordinates provides the connection characteristic of the connection assembly.

The use of the invention alleviates the need to disassemble a backplane from a card cage and the need to cut connectors as is done for each test in the conventional disassembly approach for measuring pin wipe. The test structure used by the invention is reusable and portable, and can be used to measure connection characteristics of products in a manufacturing assembly line, or out in the field (e.g., at customer sites).

In one arrangement, the detection circuit of the test structure is configured to detect, as the electrical event, formation of a parallel circuits through the first and second sets of contacts. Accordingly, if the positions of the contacts which form the parallel circuits are distributed along an edge of the test structure, the formation of the parallel circuits provides an indication to the user that the first set of contacts is evenly aligned (i.e., not substantially crooked) with the second set of contacts at the point of contact between the first and second sets of contacts.

In one arrangement, the first set of contacts belong to a first set of connectors, and the second set of contacts belong to a second set of connectors. In this arrangement, the measuring device of the test structure is configured to output a measurement value, as the second position coordinate, in response to detection of movement of the first set of connectors into a fully seated position relative to the second set of connectors, as the mechanical event. Accordingly, the user can read the measurement value of the measuring device when the first set of connectors are fully seated relative to the second set of connectors, and subsequently determine the connection characteristic based on that measurement value.

In one arrangement, the connection assembly further includes a card cage having a backplane. In this arrangement, the first set of contacts belong to a first set of connectors which is mounted to the support member, and the second set of contacts belong to a second set of connectors which is mounted to the backplane. The support member of the test structure is configured to move relative to the backplane within the card cage such that the first set of contacts move relative to the second set of contacts. As such, the user can use the invention to measure position coordinates while the backplane resides within the card cage, and the user does not need to extract the backplane from the card cage.

In one arrangement, the measuring device of the test structure is configured to provide a first measurement as the first position coordinate, and a second measurement as the second position coordinate. In this arrangement, the first and second measurements indicate locations along an axis. Accordingly, the difference between the first and second position coordinates is a straight line distance (i.e., pin wipe) along that axis.

The features of the invention, as described above, may be employed in systems, devices and methods for testing computer systems (e.g., data storage systems) and other computer-related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for obtaining a connection characteristic (e.g., pin wipe) of a connection assembly having circuit board contacts and backplane contacts using less destructive approaches than a conventional disassembly approach. That is, the invention does not rely on disassembling a backplane from a card cage and cutting connectors. In one arrangement, the invention measures pin wipe using a test structure in place of a normal operating circuit board. Preferably, the test structure is reusable and portable, and can be used to measure pin wipe of products in a manufacturing assembly line, or out in the field (e.g., at customer sites). The techniques of the invention may be used when testing computer systems and other computer-related devices such as those manufactured by EMC Corporation of Hopkinton, Mass.

Figure 1:
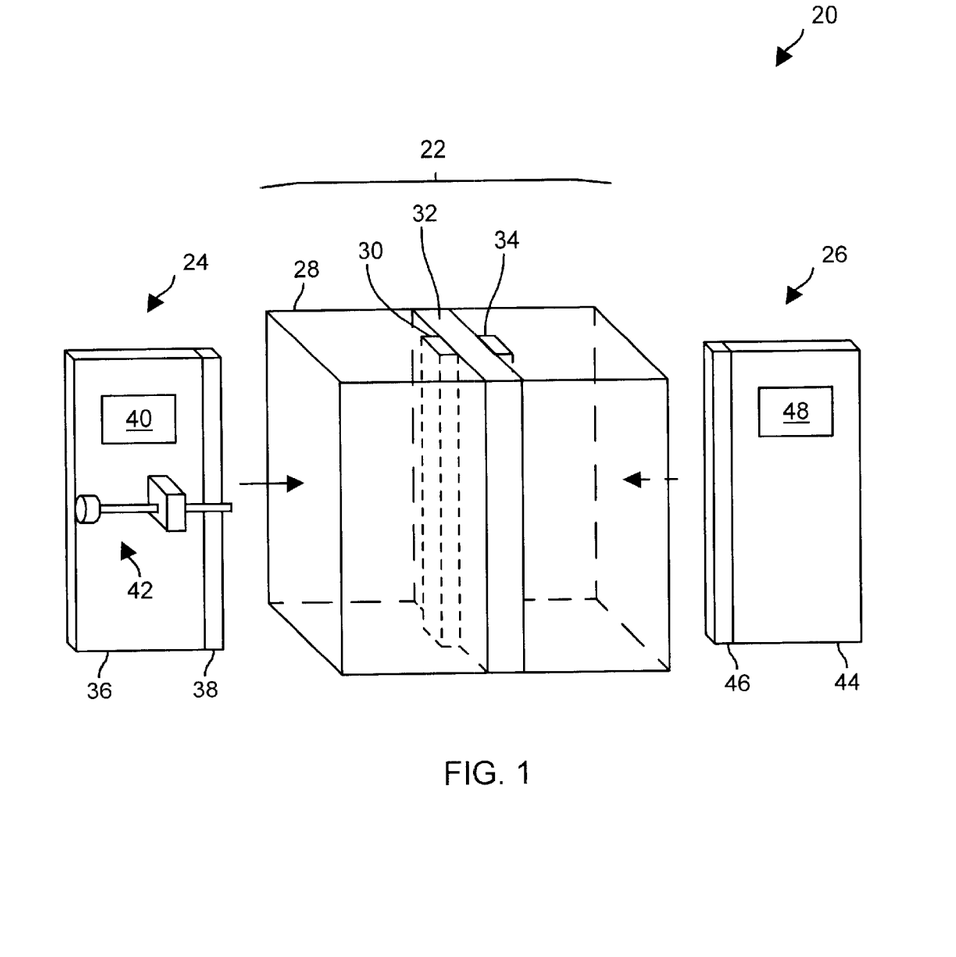
FIG. 1 is a block diagram of a connection system which is suitable for use by the invention.

FIG. 1 shows a connection system 20 which is suitable for use by the invention. The connection system 20 includes a cabinet assembly 22, a primary circuit board 24 and a secondary circuit board 26. The cabinet assembly 22 includes a card cage 28, backplane connectors 30 (e.g., arranged in a column) for connecting to the primary circuit board 24, a backplane 32, and backplane connectors 34 for connecting to the secondary circuit board 26. The primary circuit board 24 includes a support member 36 (e.g., sandwiched layers of conductive and non-conductive circuit board material), circuit board connectors 38 (e.g., arranged in a column), a detection circuit 40 and a measuring device 42. The secondary circuit board 26 includes a support member 44 (e.g., circuit board material), circuit board connectors 46 and circuitry 48. Preferably, the circuit board connectors 38, 46 are substantially similar to circuit board connectors used by normal operating circuit boards (e.g., processor boards, memory boards, interface boards, etc.) which install within the cabinet assembly 22 to form an operating computer system.

The circuit boards 24, 26 are configured to install within the cabinet assembly 22. In particular, the primary circuit board 24 is configured to slide within the card cage 28 in order for the circuit board connectors 38 to properly align with and engage the backplane connectors 30. Similarly, the secondary circuit board 26 is configured to slide within the card cage 28 in order for the circuit board connectors 46 to properly align with and engage the backplane connectors 34. In one arrangement, and as will be described in further detail later, a user can initially install the secondary circuit board 26, and then move the circuit board 24 within the card cage 22 and obtain a connection characteristic of a connection assembly formed, at least in part, by the circuit board connectors 38 and the backplane connectors 30 by monitoring the detection circuit 40 and operating the measuring device 42. Further details of how the circuit board connectors 38, 46 form electrical connections with the backplane connectors 30, 34 will now be provided with reference to FIGS. 2–4.

Figure 2:
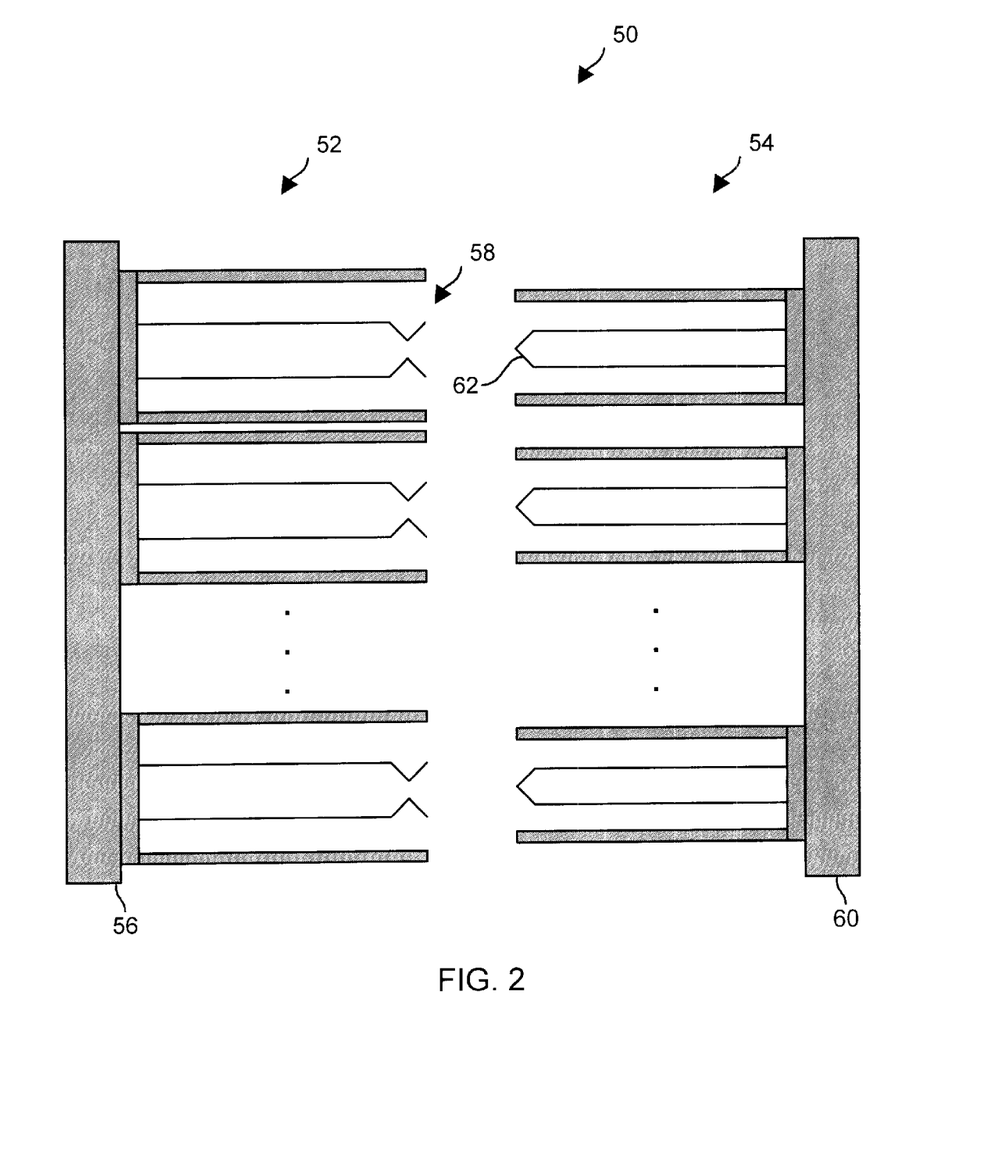
FIG. 2 is a cross-sectional side view of a connection assembly of the connection system of FIG. 1.

FIG. 2 shows a cross-sectional side view 50 of a circuit board connector 52 which is suitable for use as any of the circuit board connectors 38, 46 of FIG. 1, and a backplane connector 54 which is suitable for use as any of the backplane connectors 30, 34. The circuit board connector 52 includes a housing 56, and pin-receiving contacts 58. The backplane connector 54 includes a housing 60 and pin contacts 62, or simply pins 62. The connectors 52, 54 are configured to mate in order form reliable electrical connections between the pin-receiving contacts 58 and the pins 62.

In one arrangement, the circuit board connector 52 includes multiple columns of contacts 58. That is, the circuit board connector 52 has an M×N array of contacts 58 (M and N being positive integers). In this arrangement, the backplane connector 54 similarly includes multiple columns of contacts 62, i.e., an M×N array of contacts 62, which correspond to the M×N array of contacts 58 of the circuit board connector 52.

Figure 3:
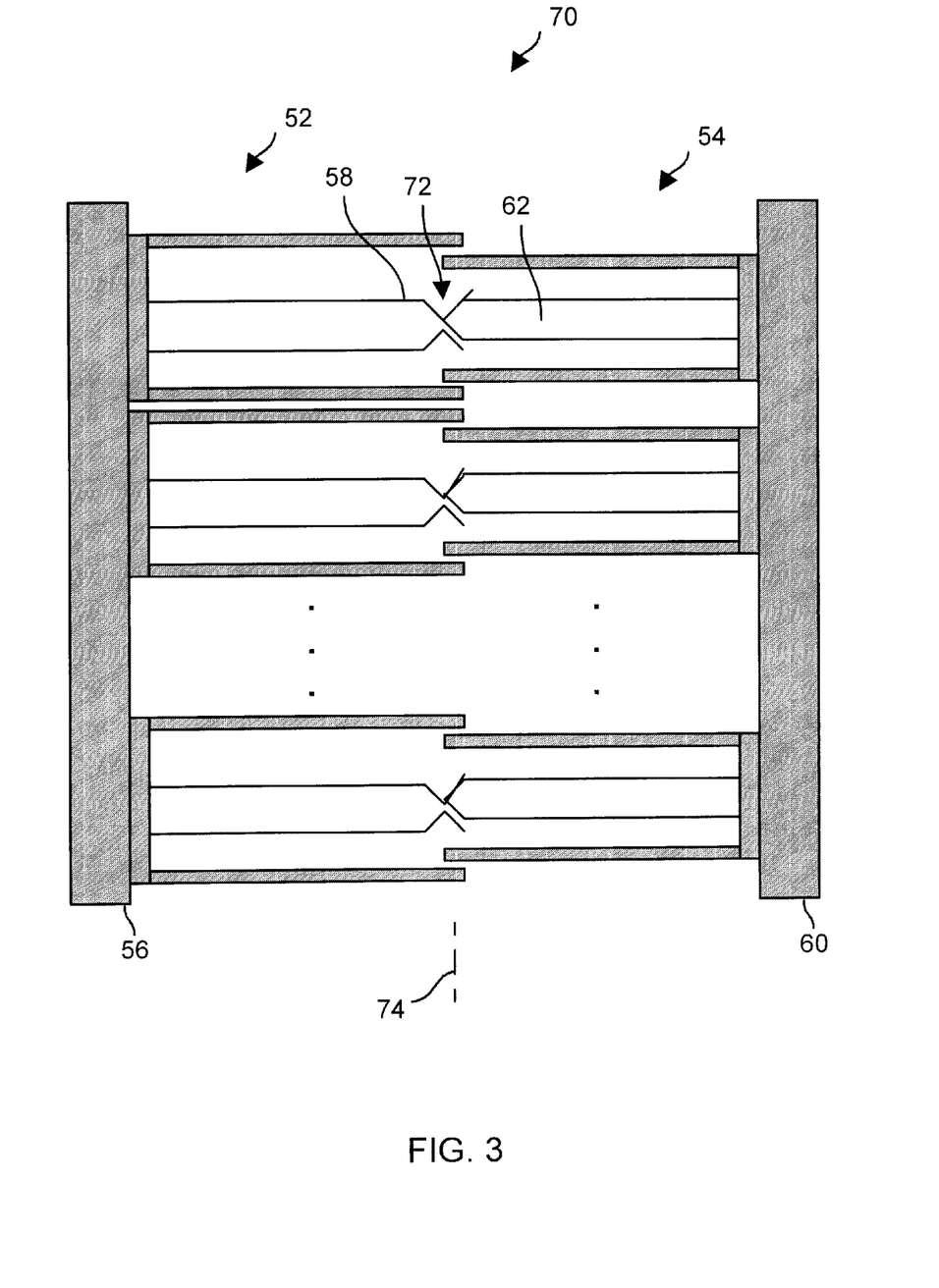
FIG. 3 is a cross-sectional side view of the connection assembly of FIG. 2 when a first set of connectors and a second set of connectors of the connection assembly are at a point of contact.

FIG. 3 shows a cross-sectional side view 70 of the connectors 52, 54 of FIG. 2 when the circuit board connector 52 and the backplane connector 54 are moved together and make electrical contact. Such an event occurs when a user inserts the primary circuit board 24 through an opening of the card cage 28 (see FIG. 1) and slides the primary circuit board 24 toward the backplane connectors 30 and the backplane 32. As shown in FIG. 3, each pin-receiving contact 58 and corresponding pin 62 has reached a point of contact 72. As will be described in further detail later, the user can use the detection circuit 40 and the measuring device 42 to identify a first position coordinate 74 which corresponds to the point of contact 72.

Figure 4:
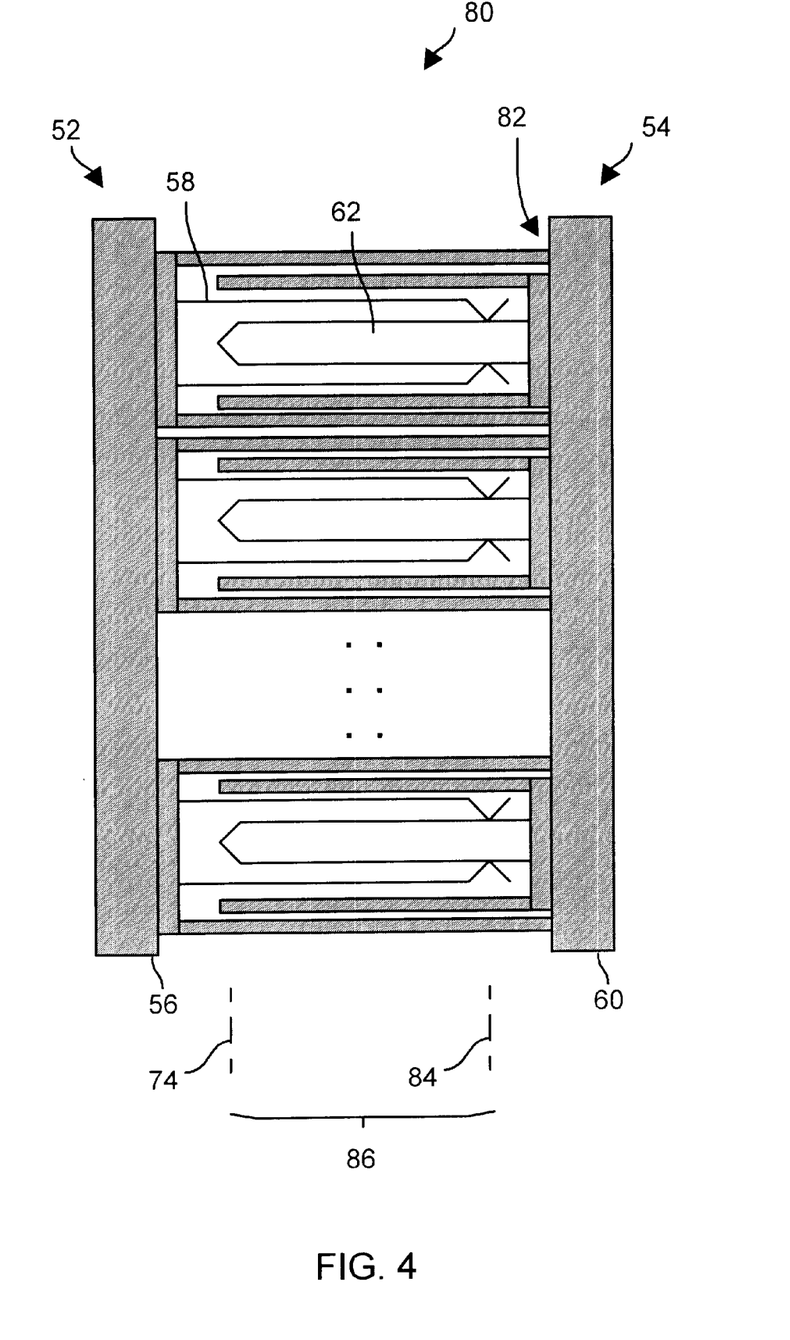
FIG. 4 is a cross-sectional side view of the connection assembly of FIG. 2 when the first set of connectors is in a fully seated position relative to the second set of connectors.

FIG. 4 shows a cross-sectional side view 80 of the connectors 52, 54 of FIGS. 2 and 3 when the circuit board connector 52 and the backplane connector 54 reach a fully seated configuration relative to each other. Such an event occurs when the user completes installation of the circuit board 24 within the cabinet assembly 22. In one arrangement, this event occurs when the user closes one or more actuation levers (e.g., circuit board levers, card cage levers, etc.) which guide the circuit board 24 within the card cage 28 for correct alignment and for application of a proper amount of insertion force. In another arrangement, the event occurs when the user cannot push the circuit board 24 any further toward the backplane 32 due to an interference fit between the circuit board 24 and an obstacle within the cabinet assembly 22 (e.g., an interference fit between the connectors 52, 54). By way of example only, FIG. 4 shows the housing 56 of the circuit board connector 52 and the housing 60 of the backplane connector 54 forming an interference fit 82 preventing the circuit board connector 52 from traveling any further. As will be described in further detail below, the user can identify a second coordinate position 84 which corresponds to the fully seated configuration reached between the connectors 52, 54. Furthermore, the user can determine the amount of pin wipe 86 (a connection characteristic) offered by the connection assembly formed by the connectors 52, 54. In particular, the user can calculate, as the pin wipe amount 86, the difference between the first and second coordinate positions 74, 84. Having thus provided details of the connectors 52, 54, which are suitable for use as the connectors 38, 30, further details of the detection circuit 40 will now be provided with reference to FIG. 5.

Figure 5:
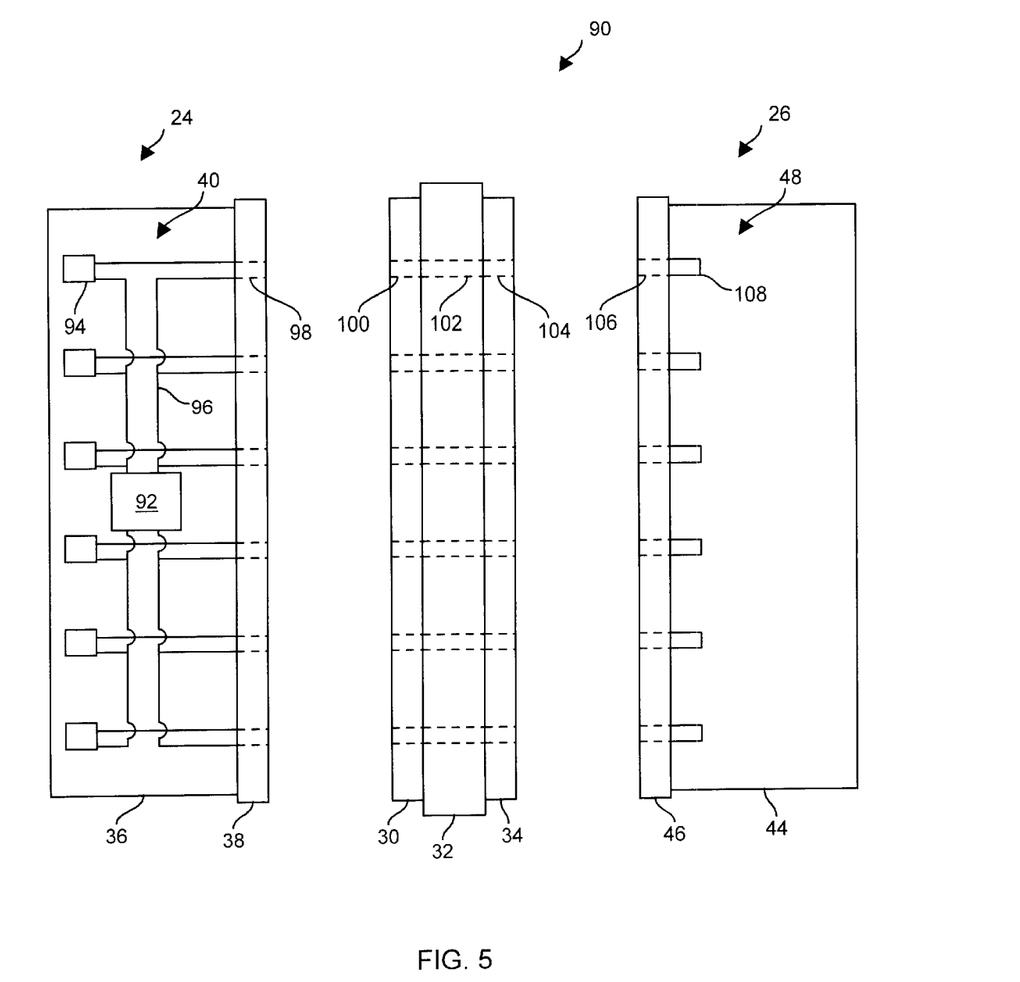
FIG. 5 is a block diagram of a detection circuit and associated electrical connections within support members, connection assemblies and a backplane of the connection system of FIG. 1.

FIG. 5 shows an electrical perspective 90 for the connection system 20 (FIG. 1). As shown in FIG. 5, the detection circuit 40 of the primary circuit board 24 includes a power source 92, light-emitting diodes (LEDs) 94 and electrical pathways 96 (e.g., metallic etch, wires fastened to the surface of the support member 36, etc.). The electrical pathways 96 of the detection circuit connect with electrical pathways 98 of the circuit board connectors 38 (e.g., see the pin-receiving contacts 58 of FIGS. 2 through 4). In a similar manner, electrical pathways 100 of the backplane connectors 30 (e.g., pins 62 of FIGS. 2 through 4) connect with electrical pathways 102 of the backplane 32 which further connect to electrical pathways 104 of the backplane connectors 34. Additionally, electrical pathways 106 of the circuit board connectors 46 connect with electrical pathways 108, i.e., loopback pathways of the circuitry 48 of the secondary circuit board 26.

When the circuit board connectors 38 of the primary circuit board 24 mate with the backplane connectors 30, and when the circuit board connectors 46 of the secondary circuit board 26 mate with the backplane connectors 34, the detection circuit 40, and electrical pathways 98, 100, 102, 104, 106 and 108 form multiple parallel circuits resulting in activation of the LEDs 94. Lighting of all of the LEDs 94 signals to the user that sufficient electrical contact has been made through the arrangement 90 (including the connectors 38, 30, 34, 46). Further details of how the connection system 20 operates will be provided with reference to FIG. 6 and FIG. 1.

Figure 6:
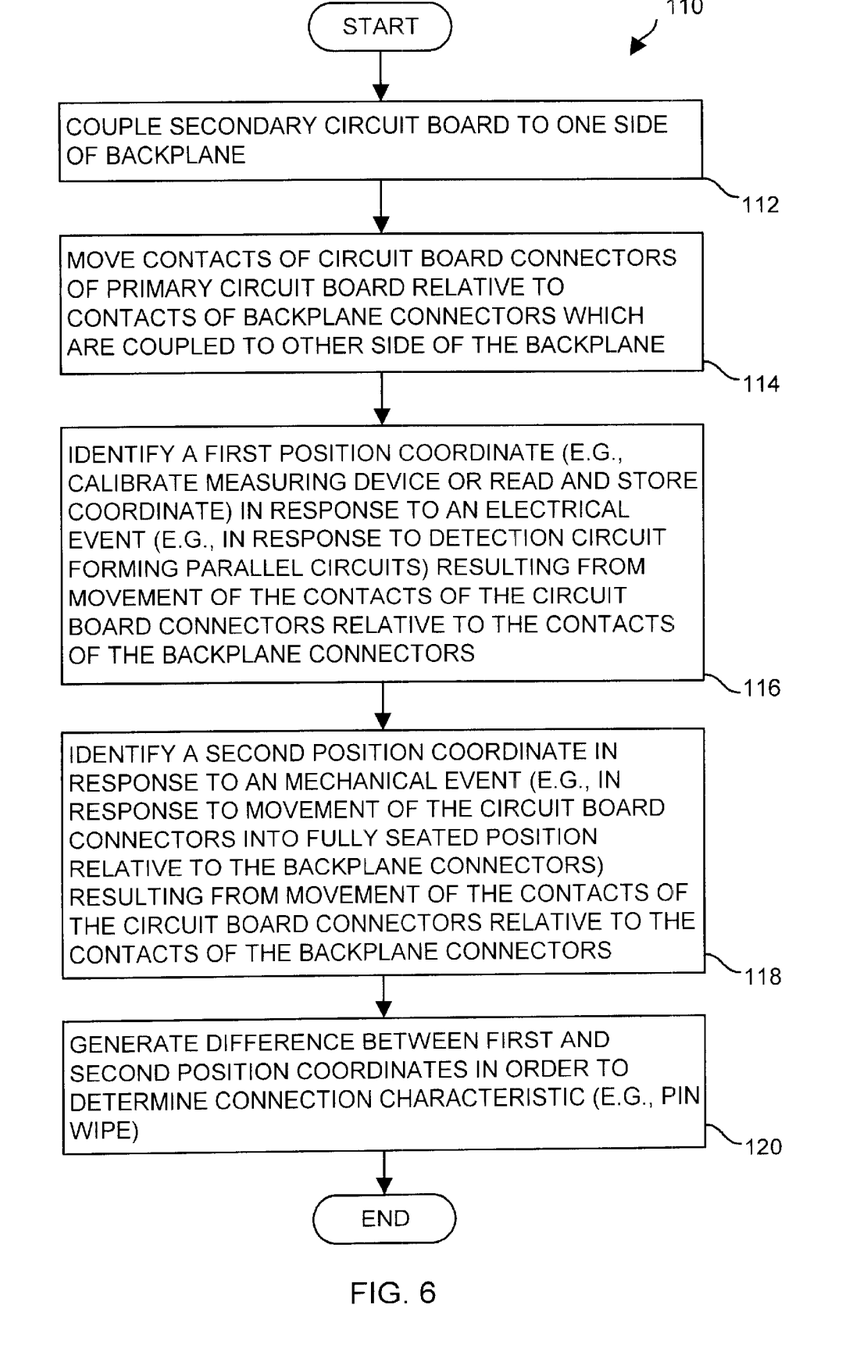
FIG. 6 is a flow diagram of a procedure performed by a user when using the connection system of FIG. 1 to obtain a connection characteristic of the connection assembly of the connection system of FIG. 1.

FIG. 6 shows a procedure 110 which a user can perform in order to obtain a connection characteristic (e.g., pin wipe) of the connection system 20 of FIG. 1. In step 112, the user installs the secondary circuit board 26 within the cabinet assembly 22. In particular, the user inserts the secondary circuit board 26 into an opening within the card cage 28, and slides the secondary circuit board 26 toward the backplane 32 until the circuit board connectors 46 are fully seated within the backplane connectors 34.

In step 114, the user moves the contacts of the circuit board connectors 38 of the primary circuit board 24 relative to the contacts of the backplane connectors 30. In one arrangement, the user slides the primary circuit board 24 along an axis extending from the circuit board connectors 38 toward the backplane connectors 30.

In step 116, the user identifies a first position coordinate in response to an electrical event resulting from movement of the contacts of the circuit board connectors 38 relative to the contacts of the backplane connectors 30. In particular, the user determines when the detection circuit 40 forms parallel circuits with the other portions of the connection system 20 (the backplane connectors 30, 34, the backplane 32, and the secondary circuit board 26). Upon this occurrence, the circuit board connectors 38 have reached the point of contact with the backplane connectors 30 (also see FIG. 3). In one arrangement, the user identifies this electrical event when all of the LEDs 94 turn on. It should be understood that there is an extremely high level of confidence that all of the contacts of the circuit board connectors 38 have made electrical contact with corresponding contacts of the backplane connectors 30 in an arrangement where the contacts forming the parallel circuits are evenly distributed along the connecting edge of the primary circuit board 24, as shown by way of example in FIG. 5).

In step 118, the user identifies a second position coordinate in response to a mechanical event resulting from movement of the contacts of the circuit board connectors 38 relative to the contacts of the backplane connectors 30. In particular, the user determines when the contacts of the circuit board connectors 38 reach a fully seated position relative to the contacts of the backplane connectors 30. In one arrangement, this mechanical event occurs when the user fully closes levers on the primary circuit board 24 (or perhaps the card cage 28) which assist in guiding the primary circuit board 24 to its fully seated position within the card cage 28. In another arrangement, this mechanical event occurs when the user reaches an interference fit condition between the circuit board 24 and the cabinet assembly 22 (e.g., the interference fit 82 between connectors 52, 54 illustrated in FIG. 4).

In step 120, the user generates the connection characteristic based on the first and second position coordinates identified in steps 116 and 118. In particular, the user generates, as the connection characteristic, a difference between the first and second position coordinates. This difference is the amount of pin wipe available for forming electrical connections between a connection assembly including the circuit board connectors 38 and the backplane connectors 30 (see the pin wipe measurement 86 of FIG. 4).

The user can compare the amount of measured pin wipe with an expected amount of pin wipe intended when designing the connection system 20. If the measured pin wipe is substantially less than the intended pin wipe, the user becomes aware of a potential connection problem. The user can then further investigate by studying the design for design flaws, examining component tolerances for components which exceed their design tolerances, improper assembly of the cabinet assembly, etc. However, if the user determines that the measured pin wipe is an acceptable value (e.g., falls within an acceptable range), the user can rule out inadequate pin wipe as a potential source of connection problems.

It should be understood that the user can apply the invention to a manufacturing situation. For example, suppose that a manufacturer assembles the cabinet assembly 22 of FIG. 1 for use with operating circuit boards (e.g., processor boards, memory boards, adaptor boards, etc.). The user can simply remove the operating circuit boards, and use the primary and secondary circuit boards 24, 26 in accordance with the procedure 110 of FIG. 6 to verify that the cabinet assemblies 22 are assembled to produce adequate pin wipe with an operating circuit board which will eventually install in place of the primary circuit board 24. If the measured pin wipe is a suitable value, the user can deem the cabinet assembly 22 as having passed a pin wipe test. However, if the measured pin wipe is inadequate, the user can further inspect the cabinet assembly 22 for the source of the inadequate pin wipe in order to correct the problem while the cabinet assembly 22 is still on the assembly line and prior to shipment.

Similarly, it should be understood that the user can apply the invention to problem identification situations in the field (i.e., a customer site). For example, suppose that a field technician responds to a service call from an installation location reporting intermittent computer system failures. The technician can remove the operating circuit boards from the cabinet assembly 22 at the field location, and use the primary and secondary circuit boards 24, 26 in accordance with the procedure 110 of FIG. 6 to determine whether an inadequate amount of pin wipe is potentially a source of the intermittent failures. If the measured pin wipe is a suitable value, the technician can rule out pin wipe as a problem and focus efforts to other possible problem areas. On the other hand, if the measured pin wipe is inadequate, the technician can further examine the cabinet assembly 22 for a cause of the inadequate pin wipe and possibly cure the intermittent failure problem.

It should be understood that the conventional disassembly approach is unsuitable or at least inefficient as an assembly line test or a field test since the disassembly approach applied to the cabinet assembly 22 would require removal of the backplane 32 from the cabinet assembly 22 and cutting of the backplane connectors 30 to obtain a visual cross-sectional side view of the backplane connectors 30. However, the invention is directed to techniques for obtaining a connection characteristic (e.g., pin wipe) of a connection assembly having circuit board contacts and backplane contacts using less destructive approaches than the conventional disassembly approach. In particular, the invention does not rely on disassembling a backplane from a card cage and cutting connectors. Rather, the invention measures pin wipe using a test structure in place of a normal operating circuit board. Preferably, the test structure is reusable and portable, and can be used to measure pin wipe of products in a manufacturing assembly line, or out in the field. The features of the invention may be particularly useful when applied testing systems and methods such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

Figure 7:
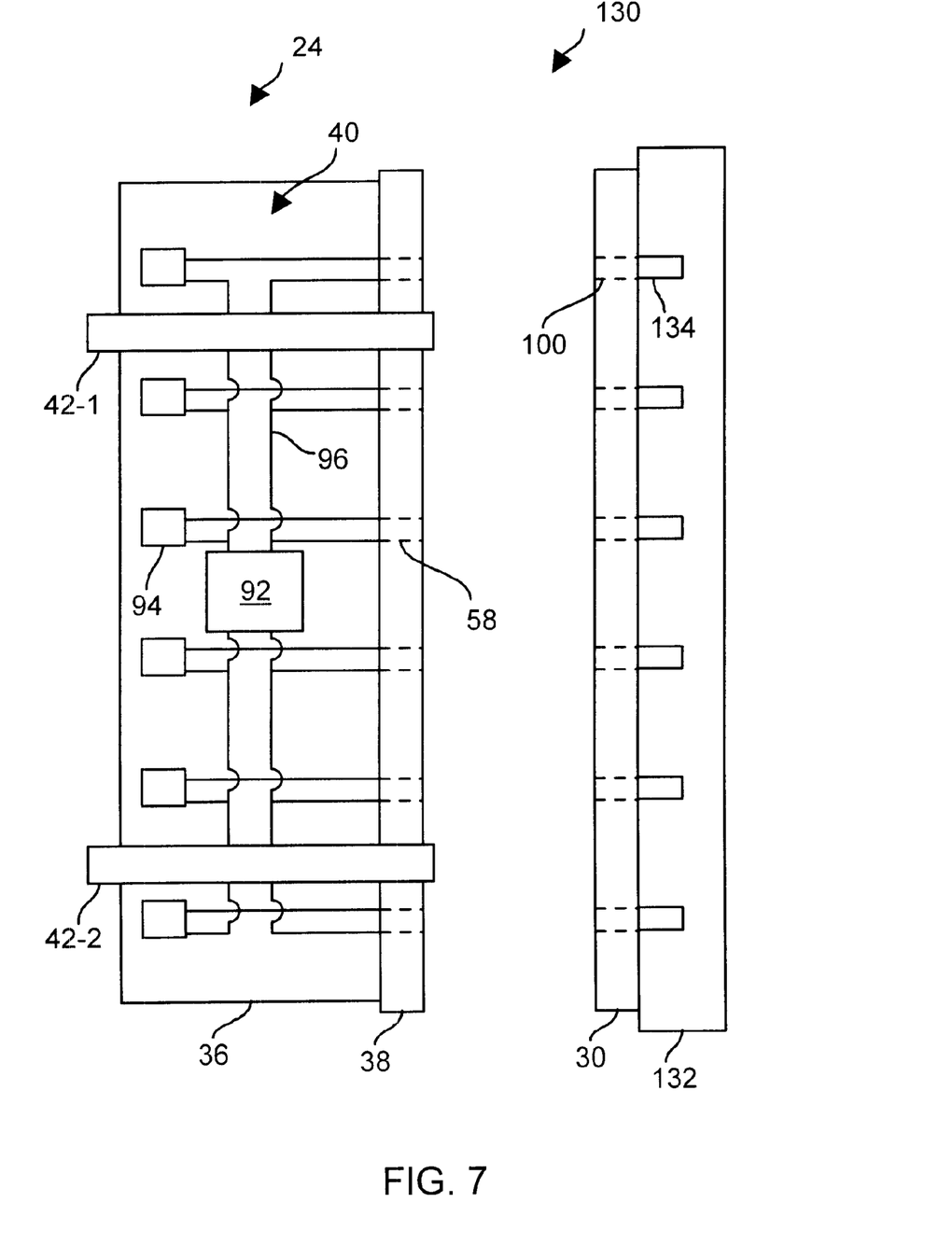
FIG. 7 is a block diagram of a detection circuit and associated electrical connections within a support member, a connection assembly and a backplane of an alternative connection system which is suitable for use by the invention.

For example, FIG. 7 shows an alternative arrangement 130 which is similar to the arrangement 90 of FIG. 5 except that there is no need for a secondary circuit board. Recall that the connection system 20 of FIG. 1 uses a primary circuit board 24 and a secondary circuit board 26 because the cabinet assembly 22 uses, by way of example only, a card cage 28 and backplane 32 designed to receive operating circuit boards on both sides. In contrast, some cabinet assemblies may receive operating circuit boards only on one side such as that shown in FIG. 7. Here, the circuit board 24 (i.e., the detection circuit 40) and the backplane connectors 30 can remain unaltered. However, the arrangement 130 uses a backplane 132 and relies on electrical pathways 134 through the backplane 132 providing loopback pathways which are similar to the loopback pathways provided by the circuitry 48 of the secondary circuit board 26 of FIG. 5. As such, a user performing the procedure 110 of FIG. 6 does not perform step 112. Accordingly, the invention is suitable for use by arrangements which have circuit boards connecting to only one side (FIG. 7) or multiple sides (FIG. 5) of a backplane.

Additionally, it should be understood that the pathways of the backplane 32 of FIG. 5 provided electrical pathways straight through one side of the backplane 32 to the other by way of example only. For some backplanes, the electrical pathways may pass through but not straight through as in FIG. 5. For such backplanes, the electrical pathways of the secondary circuit board 26 can be routed or wired to accommodate the electrical pathways of the backplane in order to provide loopback pathways which form parallel circuits with the detection circuit 40 of the primary circuit board 24.

Similarly, it should be understood that the backplane 132 of FIG. 7 provides evenly distributed loopback pathways 134 by way of example only. Some backplanes which connect with circuit boards on only one side may not provide such evenly distributed loopback pathways. For these situations, the detection circuit 40 of the circuit board 40 can be routed or wired to form, through the backplane, parallel circuits which are roughly distributed along the edge of the circuit board 24. Well distributed parallel circuits provide the user with greater confidence that each of the circuit board connectors 38 is in electrical contact with the backplane connectors 30 during pin wipe measurement.

Furthermore, it should be understood that the circuit board connectors 38, 46, 52 were described as having pin-receiving contacts (e.g., contacts 58 of FIGS. 2 through 4), and the backplane connectors 30, 34, 54 were described as having pin contacts (e.g., pins 62 of FIGS. 2 through 4) by way of example only. Other types of contacts are suitable for use by the invention such as (fingers, pads, plugs, etc.). Moreover, the pin-receiving contacts 58 and the pins 62 can be reversed for the circuit board connectors 38, 46, 52, and the backplane connectors 30, 34, 54. That is, the circuit board connectors 38, 46, 52 can have the pins 62, and the backplane connectors 30, 34, 54 can have the pin-receiving contacts 58.

Additionally, the techniques of the invention can be applied to connection technologies other than circuit board technologies. For example, the techniques can be applied to measuring connection characteristics of disk drives. In particular, a disk drive assembly can include a detection circuit 40 (e.g., see FIG. 7) and a measuring device 42 to measure pin wipe between disk drive connectors and backplane connectors that connect the disk drive unit to other computer components.

Furthermore, the measuring device 42 of the circuit board 24 is shown as a back-plunger-type dial indicator by way of example only. For the dial indicator, the user can simply read coordinate positions as an output on the face of the dial. When the user identifies the first position coordinate, the user can either read the output of the dial, or calibrate the dial (e.g., set it to zero). Then, when the user identifies the second position coordinate, the user can read the output of the dial. If the user calibrates the dial when taking the first position coordinate, the second position coordinate is also the amount of measured pin wipe (i.e., the second position coordinate minus zero is the second position coordinate). One dial indicator which is suitable for use as the measuring device 42 is a Mitutoyo Gauge Model No.: 1166 distributed by Mitutoyo America Corporation of Aurora, Ill.

Additionally, as shown in FIG. 7, it should be understood that the circuit board 24 can include multiple measuring devices. For example, the circuit board 24 can include a first measuring device 42-1 near the top and a second measuring device 42-2 near the bottom. This configuration provides multiple pin wipe measurements as the connection characteristic. A substantial difference in pin wipe measurements can signal alignment problems, warping of components (e.g., the connectors, the backplane, the circuit board, etc.), or other problems (e.g., tolerance problems).

Measuring devices other than a dial indicator are suitable for use by the invention as well. For example, the circuit board 24 can include a ruler fastened horizontally to the support member 36 (i.e., the axis of the rule is along the direction of movement for the circuit board 24), and the user can simply read values off the ruler (e.g., the values can line up with the side of the card cage 28 or a fixed measuring point on the card cage 28).

Furthermore, it should be understood that the secondary circuit board 26 of FIGS. 1 and 5 can be configured with one or more measuring devices 42 in order to measure pin wipe between the circuit board connectors 46 and the backplane connectors 34. In such an arrangement, the primary circuit board 24 can be initially installed in the cabinet assembly 22 (e.g., as step 112 of FIG. 6), and the user can move the secondary circuit board within the card cage 28 (step 114) and identify the first and second position coordinates (steps 116 and 118) while moving the second circuit board 26. A second user can watch the LEDs of the primary circuit board 24 or the first user can periodically go around the cabinet assembly 22 to watch the LEDs as the user moves the secondary circuit board 26 in order to detect the electrical event, i.e., placing the circuit board connectors 46 of the secondary circuit board 26 in electrical contact with the backplane connectors 34 in order to form parallel circuits using the detection circuit 40 of the primary circuit board 24.

Additionally, it should be understood that the detection circuit 40 can use notification devices other than multiple LEDs. For example, the detection circuit 40 can use a single LED which lights, or a meter which activates, only when all of the parallel circuits are formed. Alternatively, the detection circuit 40 can use a sound generating device (e.g., a buzzer) which activates when all of the parallel circuits are formed. Moreover, the detection circuit 40 can form a single series circuit having a pathway which passes multiple times (e.g., six, a dozen, etc.) through the backplane connectors when the circuit board connectors 38 make electrical contact with the backplane connectors 30, and then activates an output device (e.g., an LED, a buzzer, etc.).

What is claimed is:

1. A method for obtaining a connection characteristic of a connection assembly having a first set of contacts and a second set of contacts, the method comprising the steps of:

moving the first set of contacts relative to the second set of contacts;

identifying a first position coordinate in response to an electrical event resulting from movement of the first set of contacts relative to the second set of contacts; and identifying a second position coordinate in response to a mechanical event resulting from movement of the first set of contacts relative to the second set of contacts, a difference between the first and second position coordinates providing the connection characteristic of the connection assembly.

2. The method of claim 1 wherein the step of identifying the first position coordinate includes the step of:
   detecting, as the electrical event, formation of a parallel circuits through the first and second sets of contacts.

3. The method of claim 2 wherein the step of identifying the first position coordinate further includes the step of:
   calibrating a measuring device in response to the detected formation of the parallel circuits.

4. The method of claim 1 wherein the first set of contacts belong to a first set of connectors, wherein the second set of contacts belong to a second set of connectors, and wherein the step of identifying the second position coordinate includes the step of:
   detecting, as the mechanical event, movement of the first set of connectors into a fully seated position relative to the second set of connectors.

5. The method of claim 1 wherein the first set of contacts belong to a first set of connectors which is mounted to a test circuit board, wherein the second set of contacts belong to a second set of connectors which is mounted to a backplane, and wherein the step of moving the first set of contacts relative to the second set of contacts includes the step of:
   moving the test circuit board relative to the backplane such that the first set of contacts move relative to the second set of contacts.

6. The method of claim 5, further comprising the step of:
   prior to moving the first set of contacts relative to the second set of contacts, coupling a second circuit board to the backplane such that the test circuit board forms parallel circuits through the first and second sets of contacts, the backplane and the second circuit board, when the first set of contacts electrically connects with the second set of contacts.

7. The method of claim 1 wherein the step of identifying the first position coordinate includes the step of obtaining a first measurement from a measuring device, and wherein the step of identifying the second position coordinate includes the step of obtaining a second measurement from the measuring device, the first and second measurements indicating locations along an axis.

8. An apparatus for obtaining a connection characteristic of a connection assembly having a first set of contacts and a second set of contacts, comprising:
   a support member that supports the first set of contacts, and that is capable of moving relative to the second set of contacts;
   a detection circuit, coupled to the support member, that detects an electrical event resulting from movement of the first set of contacts relative to the second set of contacts; and
   a measuring device, coupled to the support member, that identifies position coordinates resulting from movement of the first set of contacts relative to the second set of contacts, the measuring device enabling a user to identify (i) a first position coordinate in response to the electrical event resulting from movement of the first set of contacts relative to the second set of contacts, and (ii) a second position coordinate in response to a mechanical event resulting from movement of the first set of contacts relative to the second set of contacts, a difference between the first and second position coordinates providing the connection characteristic of the connection assembly.

9. The apparatus of claim 8 wherein the detection circuit is configured to detect, as the electrical event, formation of a parallel circuits through the first and second sets of contacts.

10. The apparatus of claim 9 wherein the measuring device is capable of being calibrated in response to the detected formation of the parallel circuits.

11. The apparatus of claim 8 wherein the first set of contacts belong to a first set of connectors, wherein the second set of contacts belong to a second set of connectors, and wherein the measuring device is configured to output a measurement value, as the second position coordinate, in response to detection of movement of the first set of connectors into a fully seated position relative to the second set of connectors, as the mechanical event.

12. The apparatus of claim 8 wherein the first set of contacts belong to a first set of connectors which is mounted to the support member, wherein the second set of contacts belong to a second set of connectors which is mounted to a backplane within a card cage, and wherein the support member is configured to move relative to the backplane within the card cage such that the first set of contacts move relative to the second set of contacts.

13. The apparatus of claim 12 wherein a circuit board is coupled to the backplane, and wherein the detection circuit is configured to form parallel circuits through the first and second sets of contacts, the backplane and the circuit board, when the first set of contacts electrically connects with the second set of contacts.

14. The apparatus of claim 8 wherein the measuring device is configured to provide a first measurement as the first position coordinate, and a second measurement as the second position coordinate, the first and second measurements indicating locations along an axis.

15. A connection system, comprising:
    a connection assembly having a first set of contacts and a second set of contacts; and
    a test structure that obtains a connection characteristic of the connection assembly, the test structure including:
      a support member that supports the first set of contacts, and that is capable of moving relative to the second set of contacts;
      a detection circuit, coupled to the support member, that detects an electrical event resulting from movement of the first set of contacts relative to the second set of contacts; and
      a measuring device, coupled to the support member, that identifies position coordinates resulting from movement of the first set of contacts relative to the second set of contacts, the measuring device enabling a user to identify (i) a first position coordinate in response to the electrical event resulting from movement of the first set of contacts relative to the second set of contacts, and (ii) a second position coordinate in response to a mechanical event resulting from movement of the first set of contacts relative to the second set of contacts, a difference between the first and second position coordinates providing the connection characteristic of the connection assembly.

16. The system of claim 15 wherein the detection circuit of the test structure is configured to detect, as the electrical event, formation of a parallel circuits through the first and second sets of contacts.

17. The system of claim 15 wherein the first set of contacts belong to a first set of connectors, wherein the second set of contacts belong to a second set of connectors, and wherein the measuring device of the test structure is configured to output a measurement value, as the second position coordinate, in response to detection of movement of the first set of connectors into a fully seated position relative to the second set of connectors, as the mechanical event.

18. The system of claim 15 wherein the connection assembly further includes a card cage having a backplane, wherein the first set of contacts belong to a first set of connectors which is mounted to the support member, wherein the second set of contacts belong to a second set of connectors which is mounted to the backplane, and wherein the support member of the test structure is configured to move relative to the backplane within the card cage such that the first set of contacts move relative to the second set of contacts.

19. The system of claim 15 wherein the measuring device of the test structure is configured to provide a first measurement as the first position coordinate, and a second measurement as the second position coordinate, the first and second measurements indicating locations along an axis.

20. An apparatus for obtaining a connection characteristic of a connection assembly having a first set of contacts and a second set of contacts, comprising:

a support member that supports the first set of contacts, and that is capable of moving relative to the second set of contacts;

detection means, coupled to the support member, for detecting an electrical event resulting from movement of the first set of contacts relative to the second set of contacts; and a measuring device, coupled to the support member, that identifies position coordinates resulting from movement of the first set of contacts relative to the second set of contacts, the measuring device enabling a user to identify (i) a first position coordinate in response to the electrical event resulting from movement of the first set of contacts relative to the second set of contacts, and (ii) a second position coordinate in response to a mechanical event resulting from movement of the first set of contacts relative to the second set of contacts, a difference between the first and second position coordinates providing the connection characteristic of the connection assembly.

21. The apparatus of claim 20 wherein the detection means includes:

means for detecting, as the electrical event, formation of a parallel circuits through the first and second sets of contacts.

* * * * *